United States Patent
Satoh et al.

(10) Patent No.: US 8,192,577 B2
(45) Date of Patent: *Jun. 5, 2012

(54) FOCUS RING, PLASMA ETCHING APPARATUS AND PLASMA ETCHING METHOD

(75) Inventors: Daiki Satoh, Nirasaki (JP); Hideyuki Kobayashi, Nirasaki (JP); Masato Horiguchi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 177 days.

This patent is subject to a terminal disclaimer.

(21) Appl. No.: 12/491,962

(22) Filed: Jun. 25, 2009

(65) Prior Publication Data

US 2009/0255902 A1 Oct. 15, 2009

Related U.S. Application Data

(63) Continuation of application No. 11/270,461, filed on Nov. 10, 2005, now Pat. No. 7,618,515.

(60) Provisional application No. 60/635,613, filed on Dec. 14, 2004.

(30) Foreign Application Priority Data

Nov. 15, 2004 (JP) .................................. 2004-331071

(51) Int. Cl.
 *H01L 21/00* (2006.01)
(52) U.S. Cl. .................................. 156/345.51; 156/915
(58) Field of Classification Search .............. 118/723 R; 156/915

See application file for complete search history.

(56) References Cited

U.S. PATENT DOCUMENTS

| 6,447,937 | B1 | 9/2002 | Murakawa et al. |
| 2003/0024642 | A1 | 2/2003 | Suzuki et al. |
| 2006/0016561 | A1* | 1/2006 | Choi et al. ............... 156/345.51 |

FOREIGN PATENT DOCUMENTS

| JP | 11061451 A * | 3/1999 |
| JP | 11-135489 | 5/1999 |
| JP | 2004289003 A * | 10/2004 |
| JP | 2006-32965 | 2/2006 |

OTHER PUBLICATIONS

Japanese Office Action issued Aug. 10, 2010, in Patent Application No. 2004-331071 (with English-language translation).

* cited by examiner

*Primary Examiner* — Ram Kackar
*Assistant Examiner* — Anna Crowell
(74) *Attorney, Agent, or Firm* — Oblon, Spivak, McClelland, Maier & Neustadt, L.L.P.

(57) ABSTRACT

In a plasma etching apparatus for performing a plasma etching on a surface of a substrate mounted on a susceptor in a processing vessel, a focus ring is installed to surround the substrate and has a first region at an inner side on a surface thereof, in which an average surface roughness is small such that a reaction product produced during an etching processing is not captured to be deposited, and a second region at an outer side from the first region, in which an average surface roughness is large such that a reaction product produced during the etching process is captured to be deposited. A boundary between the first and the second region is a part where an etching amount is relatively significantly changed compared to other parts while the focus ring is equipped in the plasma etching apparatus and the plasma etching is performed on the substrate.

8 Claims, 6 Drawing Sheets

FOCUS RING, PLASMA ETCHING APPARATUS AND PLASMA ETCHING METHOD

CROSS-REFERENCE TO RELATED APPLICATIONS

This application is a continuation of U.S. application Ser. No. 11/270,461 filed Nov. 10, 2005, the entire contents of which is incorporated herein by reference. U.S. application Ser. No. 11/270,461 claims the benefit of priority under 119 (e) of U.S. Provisional Application No. 60/635,613, filed Dec. 14, 2004, and claims the benefit of priority under 35 U.S.C. §119 from Japanese Patent Application Number 2004-331071, filed Nov. 15, 2004.

FIELD OF THE INVENTION

The present invention relates to a focus ring, a plasma etching apparatus and a plasma etching method, wherein the focus ring is used in the plasma etching apparatus for performing an etching by using a plasma on a substrate, e.g., a semiconductor wafer, and forming, e.g., a trench on a surface of the substrate.

BACKGROUND OF THE INVENTION

A logic embedded DRAM has begun to expand its significant commercial applications into the field of digital appliances such as a digital TV, a DVD recorder, a digital still camera and the like, and has become an essential commodity item in the semiconductor industry. In case of a logic device, devices including gates in the order of tens of millions are integrated in one LSI by virtue of the 0.18 µm technology to thereby lead to the emergence of the SOC (system on chip) where various LSI's including CPU are accommodated on one silicon chip. The embedding technology needed for implementing the SOC enables each LSI to exhibit maximum performance and is required to be achieved by minimal processing steps.

A DRAM memory cell is placed at an intersection of a word line and a bit-line (digit line) crossing with each other in a grid pattern. This memory cell is formed of one selection transistor (NMOS transistor) and a capacitor (capacitance device) connected in series thereto. Namely, the DRAM memory cell is formed of two devices: one capacitor for storing charges (data); and one transistor serving as a switch for controlling input and output of the data. The capacitance device featuring such a DRAM cell structure is generally classified into two types. One is a stack capacitance cell, wherein multilayer capacitor units are disposed on the transistor to increase the overall electrode area. The other is a trench capacitance cell, wherein the capacitor is formed in a silicon substrate.

The trench capacitance cell has a good surface flatness, and is fairly compatible with a logic device fabrication process since a high temperature heat treatment such as an oxidation for a dielectric film formation or the like is carried out prior to a transistor formation. Further, in case of the trench capacitance cell, since a MOSFET formation process is started after a trench formation process is completed, the MOSFET formation process is hardly affected by the trench capacitance cell formation process. This is a merit of the trench cell in the DRAM embedding technology. On the other hand, it is disadvantageous in that a deeper trench needs to be formed to increase the storage capacitance since a high-K dielectric film cannot be used as a capacitor dielectric film. Moreover, a connection between the source/drain of the cell transistor and a capacitor electrode is getting more difficult with the scaling down of the device; and particularly, a processing beyond a 0.18 µm regime becomes very difficult. As a consequence, it is required to dig the trench deeply. This is referred to as a DT (Deep Trench: deep groove) technology.

A conventional built-in power MOSFET formed on a surface of a silicon substrate utilizes only an extremely small area on the surface of the substrate to thereby put a limitation in reducing an electrode gap since a high voltage applied thereto needs to be controlled, resulting in hampering the lowering of the on-resistance. In the DT technology, however, a trench (a groove) is formed in the silicon substrate to form the MOSFET three-dimensionally, and the electrode gap needed for a high voltage control is provided in the depth direction such that a device pitch can be reduced while maintaining a device withstand voltage of several tens of V.

In the DT (groove or hole) processing, particularly, an aspect ratio (a ratio between a length and a breadth of groove or hole) and a cross sectional shape become matters of primary concern. In this case, it is preferable that the aspect ratio is at least 10; and, as for the cross sectional shape, it is ideal that a sidewall portion thereof is of a smooth plane, a tilt angle of which is about 0 degree (perpendicular), and a bottom portion is of a semicircular recessed shape (bottom round). As mentioned above, in the DT, very highly advanced and accurate anisotropic etching is required. Here, the bottom round is to facilitate an insulating film burying process to be performed subsequently. Further, a taper angle may be added to a tilt angle in the sidewall portion to facilitate the processing in case a deposition film coverage becomes deteriorated in the insulating film burying process.

As a kind of such a trench processing technology on the silicon wafer, there is a plasma etching method, wherein an anisotropic plasma etching is performed on a single crystalline silicon layer by using, e.g., a silicon nitride film as a mask. In this case, a very small amount of oxygen ($O_2$) gas is added to an etching gas containing halogen, e.g., chlorine ($Cl_2$) gas or hydrogen bromide (HBr) gas, such that an etching is carried out by using $Cl_2$ or HBr; and SiCx and SiBrx as etching reaction products are oxidized by the supply of $O_2$ to become $SiO_2$, which is deposited on the sidewall of an etching part, thereby providing a protection thereto against the etching.

However, since the single crystalline has no base layer to stop etching, if an etching rate in a central part of the wafer is different from that in an outer periphery thereof (outer margin), in-surface uniformity of the wafer along the depth of the trench becomes deteriorated. Particularly, a large amount of reaction products will be deposited on the outer periphery of the wafer; and the etching rate along the depth direction becomes inevitably decreased as the etching progresses. The reason for this is that the range of an incident angle of radicals reaching to a bottom portion of a part to be etched becomes narrower as the trench gets deeper, and thus, a radical density becomes lowered.

Meanwhile, for performing a plasma etching on the silicon wafer, a ring member 13 called as a focus ring or the like is practically provided on a susceptor 11 to surround a periphery of a silicon wafer 12, as shown in FIG. 6. The focus ring 13, made of an insulating material, e.g., quartz or the like, functions to adjust a shape of plasma in the vicinity of a periphery (peripheral edge) of the silicon wafer. A surface of the focus ring 13 is uniformly mirror-finished. If the surface of the focus ring 13 is rough, reaction products are deposited, and deposits thereof float upwardly to be adhered on a backside or a side of the wafer W. Here, the present inventors have found that the in-surface uniformity in depth of a trench is deteriorated at the outer periphery of the wafer since a large amount of reaction products are deposited, and therefore, the focus ring has to be mirror-finished.

As a trench processing technology using a plasma, reference 1 has been known. Reference 1 discloses that a trench processing using a gaseous mixture as a processing gas is performed on a silicon by using a silicon oxide film as a mask, wherein the gaseous mixture is made of HBr (hydrogen bromide) gas as a main component, $SF_6$ (sulfur hexafluoride), $SiF_4$ (Tetrafluorosilane), He (helium) gas and $O_2$ (oxygen) gas. However, reference 1 cannot resolve the aforementioned objects.

Reference 1: Japanese Patent Laid-open Application No. H11-135489.

SUMMARY OF THE INVENTION

The present invention is contrived on the basis of the aforementioned problems, and it is an object of the present invention to provide a focus ring, and a plasma etching apparatus and a method using the same, wherein reaction products are controlled to be properly deposited when performing a plasma etching on a substrate to form a recessed portion, e.g., a trench, thereby improving the etching performance.

The present invention has been developed on the basis of an examination result on a surface of a focus ring to find that, in case when performing a trench processing on a surface of a silicon wafer by a plasma etching, in-surface uniformity in an etching rate may be slightly changed with aging after the focus ring is replaced with a new one while an etching rate in the depth direction at an outer periphery of the silicon wafer is considerably lower than that in a central portion thereof, particularly, in the beginning of the use of the new one right after the replacement. Namely, while an inner surface of the focus ring is hardly consumed, an outer surface thereof is consumed significantly more compared to the inner surface, with aging. As described above, it has been considered that, if the surface of the focus ring is rough, reaction products are captured to be deposited thereonto and deposits thereof are detached therefrom, causing particle depositions on the side or the backside of the silicon wafer. However, it has been found out that individual parts of the surface should be considered. Namely, the outer periphery of the focus ring is highly consumed, and in such a state, the difference in the etching rates between the central part and the outer periphery part of the silicon wafer is small. This means that particle depositions onto the side or the backside of the silicon wafer are caused by deposits that are expected to be deposited on the inner surface of the focus ring; and the outer surface of the focus ring is rough, so that, if reaction products are captured to be deposited thereonto, they are prevented from being deposited on the outer periphery of the silicon wafer, thereby, suppressing a decrease in the etching rate in the corresponding outer periphery. The present invention is made on the basis of such an idea.

Specifically, in accordance with one aspect of the present invention, there is provided a focus ring for use in a plasma etching apparatus for performing an etching by using a plasma on a surface of a substrate mounted on a susceptor in an airtight processing vessel, the focus ring being provided to surround a periphery of the substrate, including: a first region at an inner side on a surface thereof, in which an average surface roughness Ra is small such that reaction products produced during an etching processing are not captured to be deposited on a corresponding region; and a second region at an outer side from the first region, in which an average surface roughness Ra is large such that the reaction products are captured to be deposited on a corresponding region.

In accordance with another aspect of the present invention, there is provided a focus ring for use in a plasma etching apparatus for performing an etching by using a plasma on a surface of a substrate mounted on a susceptor in an airtight processing vessel, the focus ring being provided to surround a periphery of the substrate, including: a first region having a first average surface roughness at an inner side on a surface thereof; and a second region having a second average surface roughness larger than the first average surface roughness at an outer side from the first region.

The phrase "an average surface roughness Ra is small such that reaction products produced during an etching processing are not captured to be deposited used herein means that the surface is mirror-finished to have a very excellent flatness, e.g., an average surface roughness Ra of 0.1 or less. Since a perfect flat state cannot be realized even in case of having a very good flatness, particles of reaction products are captured to be deposited, e.g., at a molecular level, when it being microscopically considered. However, if a flatness is good, only a small amount of deposits are captured to be deposited; and, even in case where such deposits are detached to be adhered again on the backside or the side thereof, no problems are caused. The first region needs to be in such a flatness state; and the present inventors have understood from experimental results that, if an average surface roughness Ra of the first region is 0.1 or less, such a state can be maintained for a sufficiently long time that reaction products produced during an etching processing are not captured to be deposited even though the first region to be used thereafter is consumed by plasma.

Further, the phrase "a surface of a second region is finishing-processed to have a large average surface roughness Ra such that reaction products are captured to be deposited" means a following state. If a flatness of an entire region outside the first region is the same as in the first region, reaction products are not captured to be deposited, and therefore, an amount of deposits of reaction products are increased at an outer peripheral portion of the substrate, resulting in an excess protection effect on the etching. Further, an etching rate in a recessed portion, e.g., a trench, is decreased, so that a depth of the recessed portion between the central portion and the outer peripheral portion of the substrate becomes non-uniform. However, if the second region is formed and a flatness thereof is inferior to that of the first region to allow the reaction products to be captured to be deposited thereon, the etching rate in the recessed portion becomes small to thereby improve uniformity in depth of the recessed portion between the central portion and the outer peripheral portion of the substrate. Hence, the surface of the second region is roughly finished to realize such an effect, i.e., it is processed to have an average surface roughness Ra of 3.2 or less by, e.g., a sanding finishing or the like. In other words, the focus ring of the present invention may be in such a state that the inner surface thereof is polished and mirror-finished to have a small average surface roughness Ra, and the outer surface is finished to have an average surface roughness Ra larger than a corresponding average surface roughness Ra in the inner surface.

Further, the focus ring is exposed to the plasma to be consumed when it is used, wherein the outer region on the surface thereof is consumed more than the inner region. Thus, it is preferable that a boundary between the first and the second region is set at a part where an etching amount is significantly changed while the focus ring is equipped in the plasma etching apparatus and exposed to the plasma.

In accordance with still another aspect of the present invention, there is provided a plasma etching apparatus for performing an etching by using a plasma on a surface of a substrate mounted on a susceptor in an airtight processing vessel, wherein the plasma etching apparatus has the focus ring to surround a periphery of the substrate. However, the present invention is applicable for such a processing that a silicon layer is etched by a gaseous mixture of an etching gas containing a halogen and an oxygen gas, since a halogenized silicon produced by etching reacts with an oxygen to produce a silicon dioxide and this reaction product is deposited in the recessed portion to protect it from the etching.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
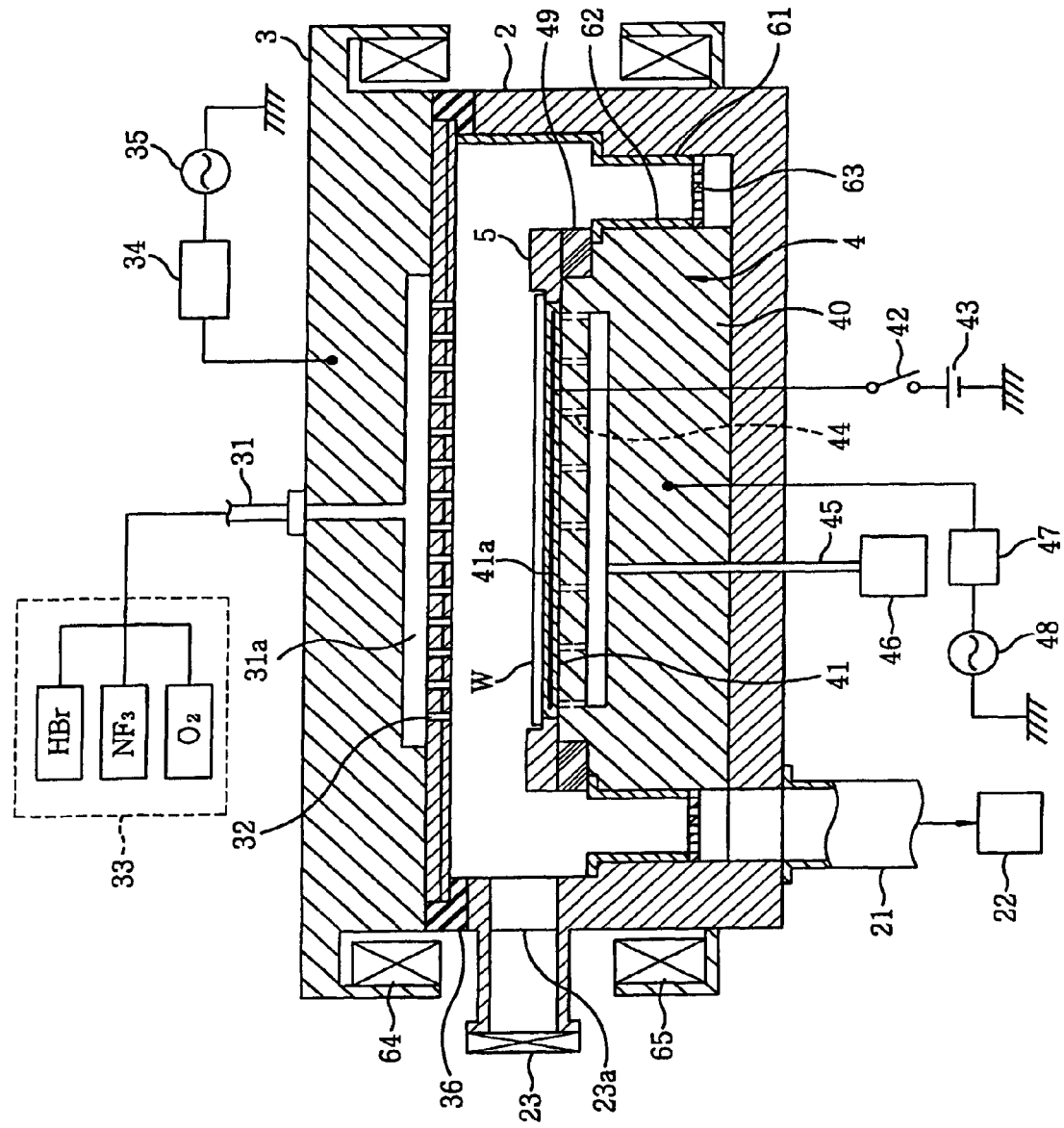
FIG. 1 provides a longitudinal side view showing a plasma etching apparatus in accordance with a preferred embodiment of the present invention.
Figure 2:
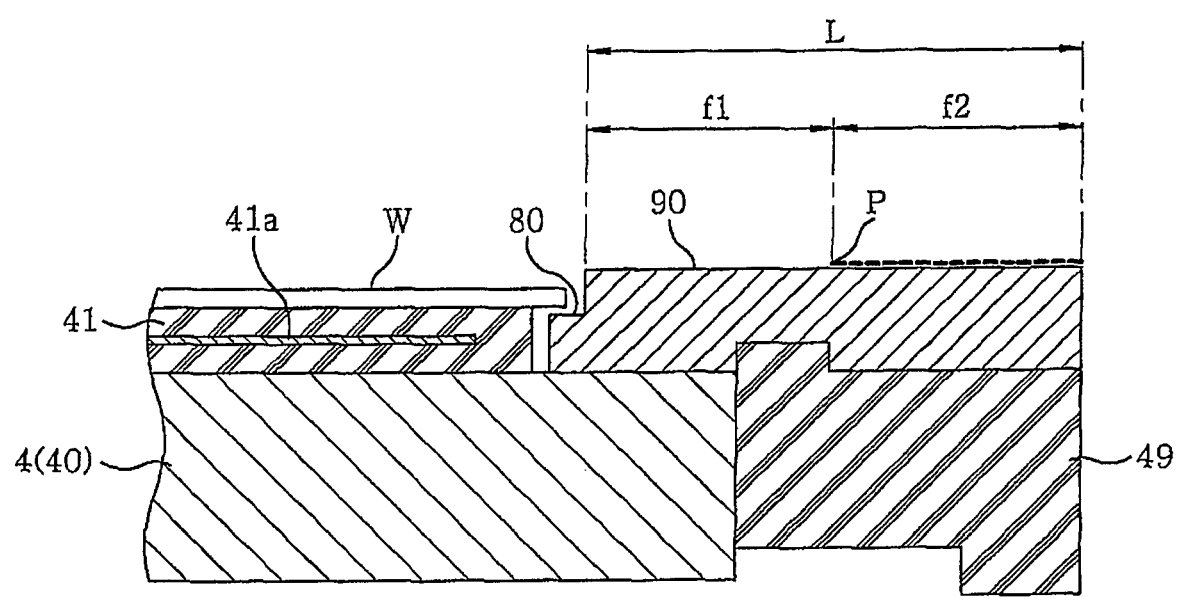
FIG. 2 sets forth a longitudinal side view showing a peripheral portion of a susceptor and a focus ring of the plasma etching apparatus.

Hereinafter, preferred embodiments of the present invention will be described in detail with reference to the accompanying drawings.

As a preferred embodiment of a plasma etching apparatus using a focus ring in accordance with the present invention, a magnetron reactive ion etching apparatus will now be explained as an example. Reference numeral 2 in the drawing indicates an airtight processing vessel made of a conductive member, e.g., aluminum, which is grounded. Further, the processing vessel 2 has an upper electrode 3 also serving as a gas shower head of a gas supply unit for introducing a processing gas for performing an etching; and a susceptor 4, also serving as a lower electrode, for mounting thereon a substrate, e.g., a silicon wafer (hereinafter, referred to as a wafer) W, the upper electrode 3 and the susceptor 4 being arranged to face each other.

Still further, a gas exhaust line 21, coupled to a bottom portion of the processing vessel 2, is coupled at the other end of the line to a vacuum pumping unit, e.g., a vacuum pump 22 such as a turbo molecular pump, a dry pump or the like. Moreover, an opening 23a, having a gate valve 23 that can be freely opened or closed, for loading or unloading the wafer W is provided in a sidewall of the processing vessel 2.

In a bottom surface side of the upper electrode 3, there is provided a plurality of gas diffusion holes 32, communicating with a gas supply line 31, e.g., a piping and a buffer chamber 31a, wherein a predetermined processing gas is configured to be injected towards the wafer W mounted on the susceptor 4. A base side of the gas supply line 31 is connected to a gas supply system 33, which has supply sources of a processing gas such as HBr gas or $NF_3$ (nitrogen trifluoride) gas, and an oxygen gas, a supply control unit such as a valve, a flow rate adjusting unit or the like, and so on. Further, to the upper electrode 3, there is connected a high frequency power supply unit 35 for supplying a high frequency power through a matching unit 34. Still further, the upper electrode 3 is insulated from the sidewall of the processing vessel 2 by an insulating member 36.

The susceptor 4 has a main body 40 made of a conductive member, e.g., aluminum or the like, and an electrostatic chuck 41 provided thereon. In the electrostatic chuck 41, there is provided, e.g., a foil shaped electrode 41a, coupled to a DC supply source 43 through a switch 42; and a DC voltage (a chuck voltage) is applied to allow the wafer W to be adsorbed on a surface of the electrostatic chuck 41 by an electrostatic force. In the main body 41, a temperature control unit (not shown) for performing a temperature control is provided, and the wafer W is maintained at a preset temperature by a temperature control operation of the temperature control unit and a heat from the plasma.

Further, on the surface of the electrostatic chuck 41, there is formed a plurality of injection openings 44 for injecting towards the backside of the wafer W a heat transfer gas, e.g., a helium (He) gas, for improving a heat transfer effect in a gap formed between the susceptor 4 and the wafer W, and for diffusing the heat transfer gas from the central portion to the outside. These injection openings 44 communicate with a heat transfer gas supply unit 46 through a heat transfer gas supply line 45 passing through the susceptor 4. Further, in the susceptor 4, there is connected a high frequency power supply unit 48 for applying thereto a bias power through a matching unit 47. Still further, elevation pins (not shown) capable of transferring the wafer W to a transfer arm (not shown) and receiving it therefrom are provided in the susceptor 4.

Still further, a focus ring 5 made of an insulating member, e.g., quartz, a ring width L of which is about 64 mm, is provided around the electrostatic chuck 4 to surround a periphery of the wafer W that is adsorbed on the electrostatic chuck 41 to be supported thereon. An insulating protection ring 49 for protecting screws of an assembly and the like is provided at an upper portion of the main body 40 of the susceptor 4; and the focus ring 5 is provided over the protection ring 49 and the main body 40 to be disposed thereon, wherein an inner peripheral portion of the focus ring 5 is formed in a stepped shape so that the focus ring has a lower step portion 80 formed at an inner peripheral side thereof and an upper step portion 90 surrounding the lower step portion 80, wherein the lower step portion 80 is placed below the periphery of the wafer outwardly protruded from the electrostatic chuck 41.

Further, the top surface of the upper step portion 90 of the focus ring 5 which is divided into a first region f1 as an inner region and a second region f2 as an outer region by using as a boundary a circle passing a point P separated by, e.g., 32 mm, from the inner periphery towards the outside thereof in the diametrical direction is finished as follows. The first region f1 is finishing-processed to have a small average surface roughness Ra such that any reaction product produced during the etching processing, e.g., a compound of silicon and oxygen, is not captured to be deposited thereon; and the second region f2 is finishing-processed to have a large average surface roughness Ra such that the reaction product is captured to be deposited thereon. The meaning thereof has been mentioned in detail in SUMMARY; and specifically, the first region f1 is processed by, e.g., a polishing to have an average surface roughness Ra of, e.g., 0.1 um (the unit is omitted in the following specification), and the second region f2 is processed by, e.g., a sanding finishing to have an average surface roughness Ra of 3.2 or less, e.g., 1.6. As already described above, if the average surface roughness Ra of the first region f1 is 0.1 or less, such a state in which no reaction product produced during the etching processing will be captured to be deposited can be maintained for a sufficiently long time even though the first region f1 to be used thereafter is etched by a plasma. As to the second region f2, if the average surface roughness Ra is too large, substantially large particles can be captured to be deposited and there will be accumulated too many deposits (deposition of the reaction product; by-product), to thereby, deteriorate uniformity. Thus, it is preferable that the average surface roughness Ra is not over 3.2.

After performing a plasma etching for a long time by employing a focus ring 5 whose entire surface was mirror-finished, the surface thereof was examined and found out that there was a boundary separated away by some distance from the inner side where the average surface roughness Ra became increased rapidly and, under such a state, the etching rate at the outer periphery of the wafer decreased minimally. By taking advantage of this finding, in the present invention, the surface is preferably prepared such that the entire surface is divided into two, the first region f1 and the second region f2, by a boundary where the average surface roughness Ra starts to rapidly increase.

Back to FIG. 1, as for other parts, there are provided, in an inner wall of the processing vessel 2, a protection barrel 61 referred to as a deposition shield or the like, made of, e.g., quartz, for preventing the reaction product from being deposited on a corresponding inner wall surface; and, in the side of the susceptor 4, a cover body 62 for preventing deposition of the reaction product. Reference numeral 63 is a baffle plate for realizing uniformity in a vacuum exhaust. Further, at an outer periphery of the processing vessel 2, there are provided upper and lower magnet units 64 and 65 formed by arranging pluralities of, e.g., permanent magnets in a ring shape to generate a predetermined magnetic field under a processing atmosphere.

In the following, a sequence of a plasma processing on a substrate, e.g., a surface of the wafer W, by using the aforementioned plasma processing apparatus will now be explained. First, the gate valve 23 is opened to load the wafer W as a substrate into the processing vessel 2 by a transfer arm (not shown); and the wafer W is mounted on the susceptor 4 by an operation of elevation pins (not shown), and at the same time, the gate valve 23 is closed such that an etching gas, e.g., HBr gas, $NF_3$ gas and a small amount of $O_2$ gas, are supplied into the processing vessel 2 through the gas shower head as the upper electrode 3 while a predetermined pressure is being maintained. At this time, the etching gas supplied into the processing vessel 2 flows along the surface of the wafer W in the diametrical direction towards the outer side thereof to thereby be discharged from the periphery of the susceptor 4.

Subsequently, a chuck voltage is applied to the electrostatic chuck 41 to have the wafer W be electrostatically adsorbed, and a He gas as a heat transfer gas is supplied towards the backside of the wafer W. Thereafter, the high frequency power supply unit 35 is turned ON such that a high frequency voltage is applied between the upper electrode 3 and the lower electrode 4 as a susceptor to convert the etching gas into a plasma; and at the same time, the high frequency power supply unit 48 is turned ON such that a bias power is applied to the wafer W to make active species in the plasma collide with the wafer W with a large vertical impact component. Further, it is configured such that a diffusion of the plasma is suppressed by an operation of the focus ring 5, and therefore, a concentration of the active species in the outer periphery of the wafer W is not lowered.

Figure 3A:
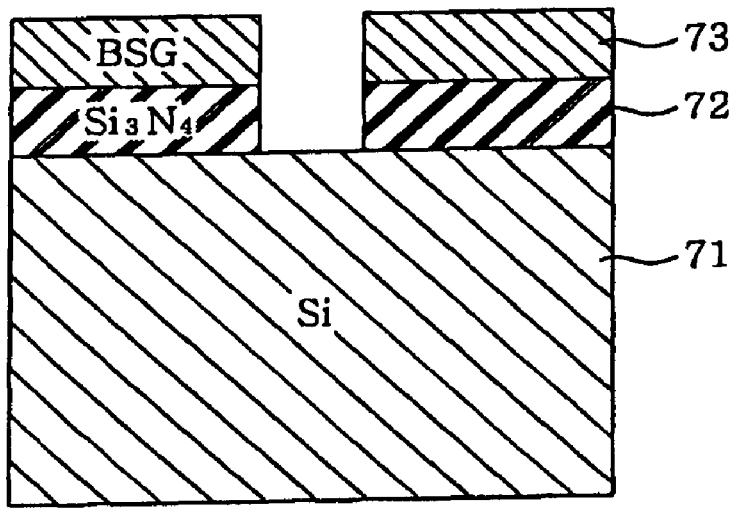
FIG. 3A present an explanatory diagram showing a substrate surface before it is etched by the plasma etching apparatus.
Figure 3B:
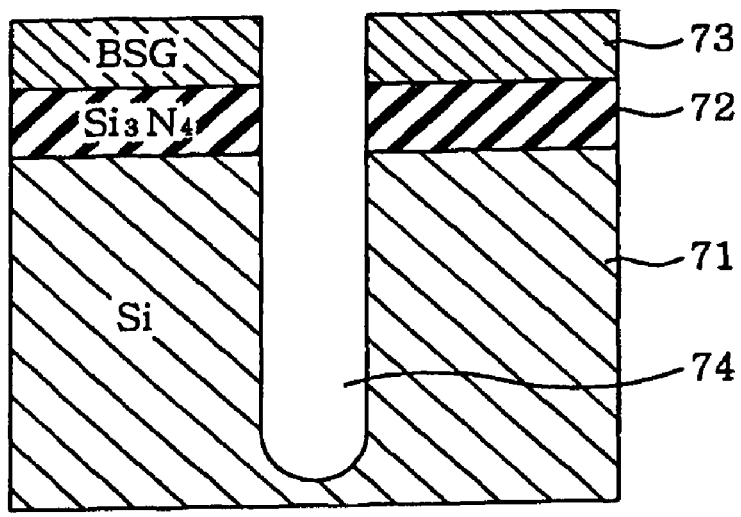
FIG. 3B offers an explanatory diagram showing a substrate surface on which a trench is formed.

FIG. 3A shows a surface part of the wafer W as a substrate to be processed; and, on a single crystalline silicon layer 71, there are stacked a silicon nitride film ($Si_3N_4$ film) 72 for a stopper during a CMP (chemical mechanical polishing) processing as a post-processing and a BSG film (boron doped non-crystal silicon oxide film) 73 as a mask during the etching, in this order. The surface part is exposed to the plasma during the etching process such that the silicon layer 71 is etched. Further, the wafer W is heated by the plasma while the susceptor 4 is cooled by a cooling unit (not shown) and the heating and the cooling operations are balanced with each other such that a set temperature is maintained. Further, the silicon layer 71 is etched by using HBr gas and $NF_3$ gas, and at the same time, SiClx and SiBrx as reaction products thereof are oxidized by $O_2$ to become an oxide such as $SiO_2$ or the like, thereby, being attached in the recess portion as a part to be etched. Accordingly, the sidewall surface is protected; and the etching proceeds in the depth direction while the etching in the horizontal direction is suppressed. FIG. 3B illustrates a state where the silicon layer 71 is etched to form a trench 74, wherein the trench 74 has a depth of, e.g., 7.5 μm and an aspect ratio of 4.0.

Further, as an example of a processing condition, a pressure in the processing vessel 2 is 2.66 Pa (200 mTorr); a power of the high frequency power supply unit 35 is 2100 W; a power of the high frequency power supply unit 48 is 900 W; a temperature of the wafer W is 80° C.; and flow rates of HBr gas, $NF_3$ gas and $O_2$ gas are set at 300/32/18 sccm.

Figure 4A:
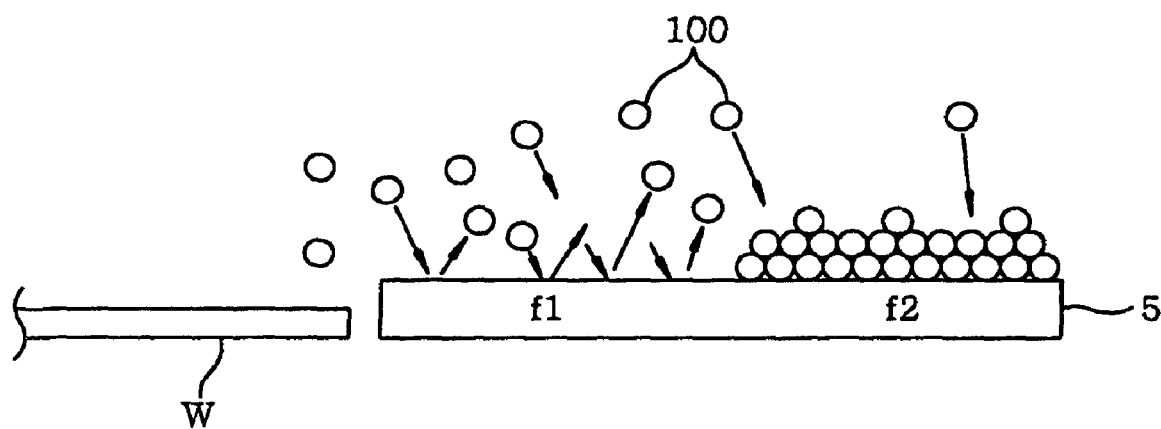
FIGS. 4A and 4B are explanatory diagrams showing attached and detached states of depositions in the focus ring of the present invention and in that of a conventional art, respectively.

Herein, the reaction products produced by the etching float upward from the surface of the wafer W to flow outside, but a part thereof is adhered to the corresponding region f2 to be captured to be deposited thereon since the surface of the second region f2 of the focus ring 5 is rough. FIG. 4A shows an image of such a state, wherein particles 100 of the reaction products are exaggerated for illustration purpose. The reaction products are considered to be floating around in the vicinity of the outer periphery of the wafer W and the surface of the focus ring 5; and some part thereof move back and forth therebetween. Therefore, some of the reaction products are captured to be deposited by the focus ring 5, so that, roughly speaking, the reaction products to be deposited on the part to be etched at the outer periphery of the wafer W becomes reduced by that amount.

Figure 4B:
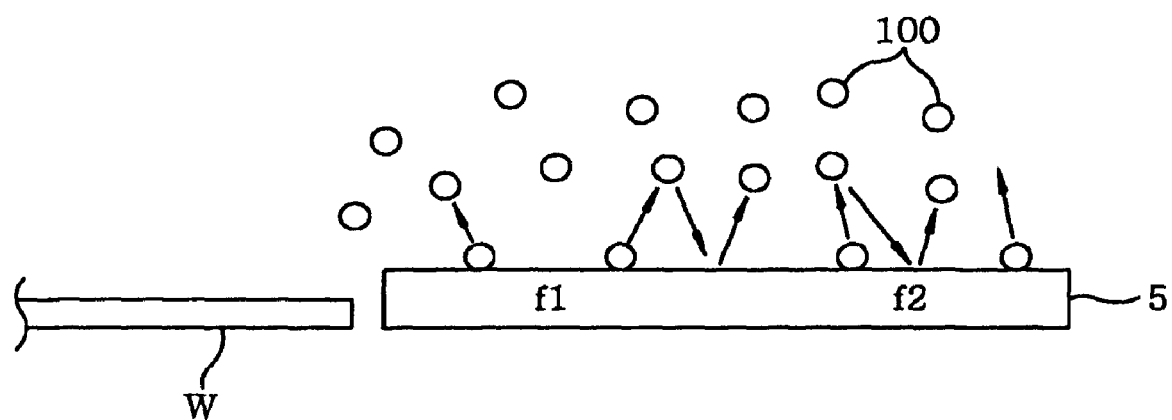

In contrast with this, FIG. 4B shows a case where an entire surface of the focus ring 5 is mirror-finished to have an excellent flatness, wherein reaction products moving upward from the surface float thereabove without being captured to be deposited and a part thereof returns to the outer periphery of the wafer W. At the outer periphery of the wafer W, the amount of reaction products to be deposited is essentially large and a protection operation from etching tends to be so strong. Hence, in the present embodiment, the protection operation becomes eased by the capturing of the floating reaction products by the focus ring 5, thereby preventing the decrease in an etching rate; and non-uniformity in depth of the trench between the central portion of the wafer W and the outer periphery thereof is mitigated, thereby, realizing improvement of in-surface uniformity. Further, an inside of the processing vessel 2 is periodically cleaned to remove the reaction products captured to be deposited on the focus ring 5, and thus, preventing particle generation due to detachment of deposits.

Still further, the first region f1 in the inner side of the focus ring 5 is very smooth, so that the reaction products are not substantially captured to be deposited. Therefore, the reaction products are prevented from being deposited at the outer periphery of the wafer W and from being floated around to be deposited again on the backside or the side of the wafer W, thereby preventing a particle contamination.

In accordance with the aforementioned embodiment, it is configured such that, in the surface of the focus ring 5, the first region f1 at the inner side has a superior flatness to prevent deposition of reaction products; and the second region f2 at the outside thereof is rough to allow the reaction products to be captured to be deposited thereon. Therefore, as described above, the particle contamination on the wafer W is suppressed, and a decrease in an etching rate at the outer periphery of the wafer W is suppressed, thereby, obtaining high in-surface uniformity in the etching processing.

The present invention is not limited to the processing for forming a trench in the silicon layer as an object to be etched; and it is applicable to the case where a recess portion for forming a wiring layer in an insulation film is formed. In this case, since deposition of reaction products is reduced at the outer periphery of the wafer W, an excessive protection operation by the reaction products is suppressed and an etching shape can be prevented from being deteriorated. Further, the material for the focus ring is not limited to an insulating material, and a conductor or a semiconductor may be used for expanding a plasma. Still further, the etching gas is not limited to the aforementioned gas; and, even in case where an oxygen gas is not added, it is applicable to an etching which produces reaction products.

[Experiment]

Subsequently, an experiment for securing an effect of the present invention will now be discussed.

On the entire surface of the focus ring 5 described in the aforementioned embodiment, a mirror finishing was carried out to obtain an average surface roughness Ra of 0.05. Subsequently, the focus ring 5 was equipped in the plasma etching apparatus shown in FIG. 1; and 1800 sheets of wafers W, each having a surface portion illustrated in FIG. 3A, were processed under the processing conditions described in the aforementioned embodiment, to thereby form trenches, respectively. After that, the focus ring 5 was detached when the total etching processing time reached 30 hours, and then, the surfaces thereof were examined. As a result, in the region S0 within the range of 5 mm from the inner periphery of the focus ring 5 to the outer side in the diametrical direction, an average surface roughness Ra was found to be 0.8; in the region S1 within the range of 32 mm from the region S0 to the outer side, an average surface roughness Ra was 0.15; and, in the region S2 within the range of 64 mm from the region S1 to the outer side, an average surface roughness Ra was 0.36.

Figure 5A:
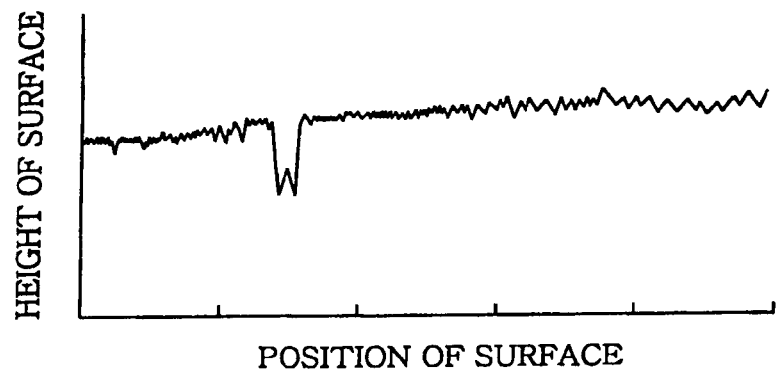
FIGS. 5A to 5C are graphs showing measurement results on irregularities of a surface of the focus ring in an experiment for confirming an effect of the present invention.
Figure 5A:
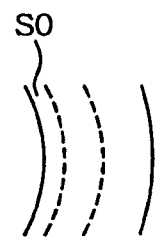
Figure 5B:
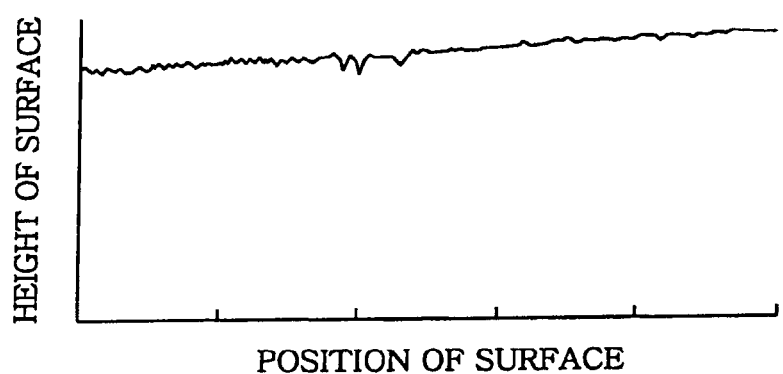
Figure 5B:
Figure 5C:
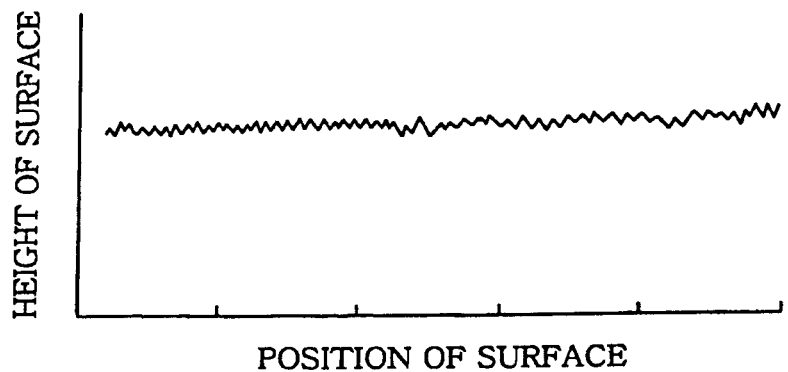
Figure 5C:
Figure 6:
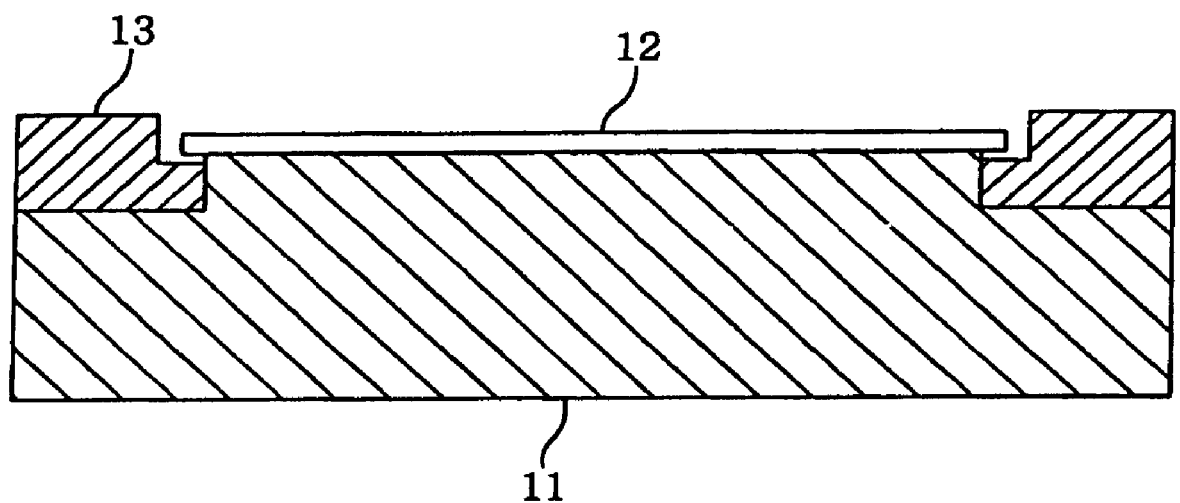
FIG. 6 describes a longitudinal side view showing a susceptor and a focus ring of a conventional plasma etching apparatus.

FIGS. 5A to 5C provide measurement data of surface heights in the respective regions S0, S1 and S2. It can be noted that a plasma density (density of an active species) is high in the vicinity of the inner periphery of the focus ring 5, so that a severe consumption is inevitable; but, in the region S1 slightly away from the inner periphery, the average surface roughness Ra is 0.15, so that consumption is not severe. Further, in the region S2 of the outer side of the focus ring 5, consumption is increased again. The reason why consumption in the region S2 of the outer side is larger than that in the region S1 of the inner side, as mentioned above, is considered that a flow velocity of the plasma in the region S2 is high, and therefore, there are many fresh active species.

Meanwhile, an examination on the etching state shows that an etching rate in the outer periphery portion is smaller by 39.5 nm/min. than that in the central portion in case of an initial stage of etching on a wafer W; and an etching rate in the outer periphery portion is smaller by 35.6 nm/min. than that in the central portion in case of the etching on a wafer W after 30 hours, thereby, uniformity in the etching rate being improved. The average surface roughness Ra in the region S1 is 0.15, wherein the flatness is substantially high such that reaction products cannot be captured to be deposited; and the average surface roughness Ra in the region S2 is 0.36, wherein reaction products can be captured to be deposited.

It can be understood that it is effective to have a region of a small average surface roughness Ra formed in the vicinity of the inner side and a region of a large average surface roughness Ra formed in the vicinity of the outside thereof in the surface of the focus ring 5. Further, if the respective average surface roughnesses Ra's in the inner side regions S0 and S1 are set at, e.g., 0.1 or less, during the formation of the focus ring 5, it is possible to keep such a state where the reaction products are prevented from being deposited to fly again towards the wafer W, even after the apparatus is used for, e.g., 400 hours. Still further, if the average surface roughness Ra in the outer side region S2 is processed at, e.g., 0.36, the reaction products are captured to be deposited from the beginning of the process, and thus, a processing can be performed with high in-surface uniformity.

EFFECT OF THE PRESENT INVENTION

In accordance with the present invention, an entire surface of a focus ring does not have a good flatness, but, in an inner surface thereof, a region of a small average surface roughness Ra is formed to prevent reaction products from being captured to be deposited, thereby, reducing depositions of particles onto a backside or a side of a substrate. On the other hand, in an outer surface thereof, a region of a large average surface roughness Ra is formed to allow the reaction products to be captured to be deposited thereon, thereby, suppressing depositions of the reaction products on an outer peripheral portion of the substrate, and hence, suppressing a decrease in an etching rate at the corresponding outer peripheral portion. Therefore, it is possible to suppress particle contamination on the substrate, and further, to improve uniformity in an etching rate between the central portion and the outer peripheral portion of the substrate such that a processing can be performed at high in-surface uniformity in depth of a recessed portion formed by an etching, for example.

While the invention has been shown and described with respect to the preferred embodiments, it will be understood by those skilled in the art that various changes and modifications may be made without departing from the scope of the invention as defined in the following claims.

What is claimed is:

1. A focus ring for use in a plasma etching apparatus for performing an etching by using a plasma on a surface of a substrate mounted on a susceptor in an airtight processing vessel, the focus ring being provided to surround a periphery of the substrate, comprising:

a lower step portion formed at an inner peripheral side of the focus ring; and an upper step portion surrounding the lower step portion, wherein a top surface of the upper step portion is divided into a first region at an inner side on the top surface of the upper step portion and a second region surrounding the first region, wherein an average surface roughness Ra of the first region is small such that a reaction product produced during an etching processing is not captured to be deposited on a corresponding region and an average surface roughness Ra of the second region is large such that a reaction product is captured to be deposited on a corresponding region and wherein the average surface roughness Ra of the first region is 0.1 um or less.

2. The focus ring of claim 1, wherein the average surface roughness Ra of the second region is 0.36 um or less.

3. The focus ring of claim 1, wherein a boundary between the first and the second region is a part where an etching amount is significantly changed while the focus ring is equipped in the plasma etching apparatus and an etching is carried out by using a plasma on the substrate.

4. A plasma etching apparatus for performing an etching by using a plasma on a surface of a substrate mounted on a susceptor in an airtight processing vessel, the plasma etching apparatus having the focus ring of claim 1 to surround a periphery of the substrate.

5. A focus ring for use in a plasma etching apparatus for performing an etching by using a plasma on a surface of a substrate mounted on a susceptor in an airtight processing vessel, the focus ring being provided to surround a periphery of the substrate, comprising:

a lower step portion formed at an inner peripheral side of the focus ring; and an upper step portion surrounding the lower step portion, wherein a top surface of the upper step portion is divided into a first region having a first average surface roughness at an inner side on the top surface of the upper step portion; and a second region having a second average surface roughness, which is greater than the first average surface roughness, surrounding the first region, and wherein the first average surface roughness is 0.1 um or less.

6. The focus ring of claim 5, wherein the second average surface roughness is 0.36 um or less.

7. The focus ring of claim 5, wherein a boundary between the first and the second region is a part where an etching amount is relatively significantly changed compared to other parts while the focus ring is equipped in the plasma etching apparatus and an etching is carried out by using a plasma on the substrate.

8. The focus ring of claim 5, wherein a boundary between the first and the second region is about a half of a width of the focus ring.

* * * * *